United States Patent
Yuasa et al.

(10) Patent No.: US 8,345,389 B2
(45) Date of Patent: Jan. 1, 2013

(54) MAGNETORESISTIVE ELEMENT UTILIZING A PELTIER EFFECT JUNCTION OF AU AND CUNI TO COOL THE ELEMENT

(75) Inventors: Hiromi Yuasa, Kanagawa-ken (JP);
Shuichi Murakami, Tokyo (JP);
Yoshihiko Fuji, Kanagawa-ken (JP);
Hideaki Fukuzawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 12/879,376

(22) Filed: Sep. 10, 2010

(65) Prior Publication Data
US 2011/0228427 A1   Sep. 22, 2011

(30) Foreign Application Priority Data
Mar. 19, 2010   (JP) .................. 2010-065226

(51) Int. Cl.
*G11B 5/39*   (2006.01)
(52) U.S. Cl. .............. 360/322; 360/324.11; 360/324.12; 360/324.2
(58) Field of Classification Search ........ 360/322–324.2
See application file for complete search history.

(56) References Cited

U.S. PATENT DOCUMENTS 7,382,584 B2 * 6/2008 Liu et al. .................. 360/313
7,525,772 B2 * 4/2009 Koui et al. ................ 360/324.1

FOREIGN PATENT DOCUMENTS

| JP | 2004-349708 | 12/2004 |
|----|-------------|---------|
| JP | 2006-108631 | 4/2006 |
| JP | 2006-261306 | 9/2006 |
| JP | 2007-19514 | 1/2007 |
| JP | 4482667 | 4/2010 |

OTHER PUBLICATIONS

Akio Fukushima, et al., "Peltier cooling in current-perpendicular-to-plane metallic junctions", Journal of applied Physics, 99, Apr. 24, 2006, 3 pages.
Japanese Office Action issued Feb. 3, 2012 in patent application No. 2010-065226 with English translation.

* cited by examiner

*Primary Examiner* — Allen Heinz
(74) *Attorney, Agent, or Firm* — Oblon, Spivak, McClelland, Maier & Neustadt, L.L.P.

(57) ABSTRACT

A magnetoresistive element includes a first ferromagnetic layer, a second ferromagnetic layer, a nonmagnetic layer, a first metal layer, a second metal layer, a first electrode, and a second electrode. The nonmagnetic layer is provided between the first ferromagnetic layer and the second ferromagnetic layer. The first metal layer includes Au and is provided so that the first ferromagnetic layer is sandwiched between the nonmagnetic layer and the first metal layer. The second metal layer includes a CuNi alloy, and is provided so that the first metal layer is sandwiched between the first ferromagnetic layer and the second metal layer. In addition, magnetization of either one of the first ferromagnetic layer and the second ferromagnetic layer is fixed in a direction. Magnetization of the other is variable in response to an external field. At least one of the first ferromagnetic layer and the second ferromagnetic layer includes a half metal.

9 Claims, 13 Drawing Sheets

1 ··· MAGNETORESISTIVE ELEMENT
2 ··· ELECTRODE
3 ··· METAL LAYER INCLUDING CuNi ALLOY
4 ··· METAL LAYER INCLUDING Au
5 ··· MAGNETIZATION FIXED LAYER
6 ··· NONMAGNETIC
7 ··· MAGNETIZATION FREE LAYER
8 ··· ELECTRODE

ELECTRON STATE IN HALF METAL

SHADED AREA DENOTES OCCUPATION BY ELECTRONS

9 ··· METAL LAYER INCLUDING CuNi ALLOY
10 ··· METAL LAYER INCLUDING Au

MAGNETORESISTIVE ELEMENT UTILIZING A PELTIER EFFECT JUNCTION OF AU AND CUNI TO COOL THE ELEMENT

CROSS REFERENCE TO RELATED APPLICATION

This application is based upon and claims the benefit of priority from the prior Japanese Patent Application No. 2010-065226, filed on Mar. 19, 2010, the entire contents of which are incorporated herein by reference.

FIELD

Embodiments relate generally to a magnetoresistive element, a magnetic head assembly, and a magnetic recording/reproducing apparatus.

BACKGROUND

A giant magnetoresistive element (Giant MagnetoResistive: GMR) has provided a dramatic improvement of the performance of a magnetic device, e.g., a magnetic head in particular. In other words, a spin valve film (Spin Valve: SV film) of all others was applied to the magnetic head, MRAM (Magnetic Random Access Memory), etc. to have brought a major advance to the technical field of magnetic devices.

The "spin valve film" is a laminated film having a nonmagnetic layer (called a "spacer layer") sandwiched between two ferromagnetic layers. One of the two magnetic layers has its magnetization fixed by an antiferromagnetic layer, and is called a "pinned layer" or a "magnetization fixed layer". The other has magnetization rotatable in response to an external magnetic field, and is called a "free layer" or a "magnetization free layer". The spin valve film provides a change in the electrical resistance due to a change in the relative angle between the magnetization directions of the pinned layer and the free layer. The rate of the resistance change is called an MR (MagnetoResistance) change rate, and corresponds to an output of magnetic elements or devices.

A magnetoresistive element is disclosed in a Japanese laid-open patent application (see, for example, JP-A 2006-108631), which sandwiches a lamination structure between electrodes including Cr or Au. The lamination structure has a nonmagnetic layer of Cu sandwiched between a magnetization pinned layer and a magnetization free layer both including Co. In the magnetoresistive element, a Peltier effect develops between the magnetization free layer including Co and the electrode including Au to cool down the gap therebetween.

The Peltier effect is a phenomenon discovered by Jean-Charles Peltier in 1834, and the cooling effect thereof is expressed with the following formula 1.

$$\Delta Q = \Pi \cdot I \cdot \Delta t \quad \text{Formula 1}$$

$\Delta Q$ (C) is an amount of heat to be released or absorbed from a junction. $\Pi$ is a substance-specific coefficient. $\Delta t$ (s) is a time of interval for which a current has been flowed. I (A) is the current. The efficiency for cooling or heating is determined by the substance-specific Peltier coefficient, thereby requiring a proper choice for material combinations to efficiently cool down.

However, the magnetoresistive element disclosed in the Japanese laid-open patent application employs Co for the magnetization free layer to cool the Co itself, but does not have a high MR change rate owing to the Co. Therefore, a higher MR change rate cannot be expected even when cooled by using the Peltier effect.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

DETAILED DESCRIPTION

Embodiments are explained in detail with reference to drawings below.

First Embodiment

Figure 1:
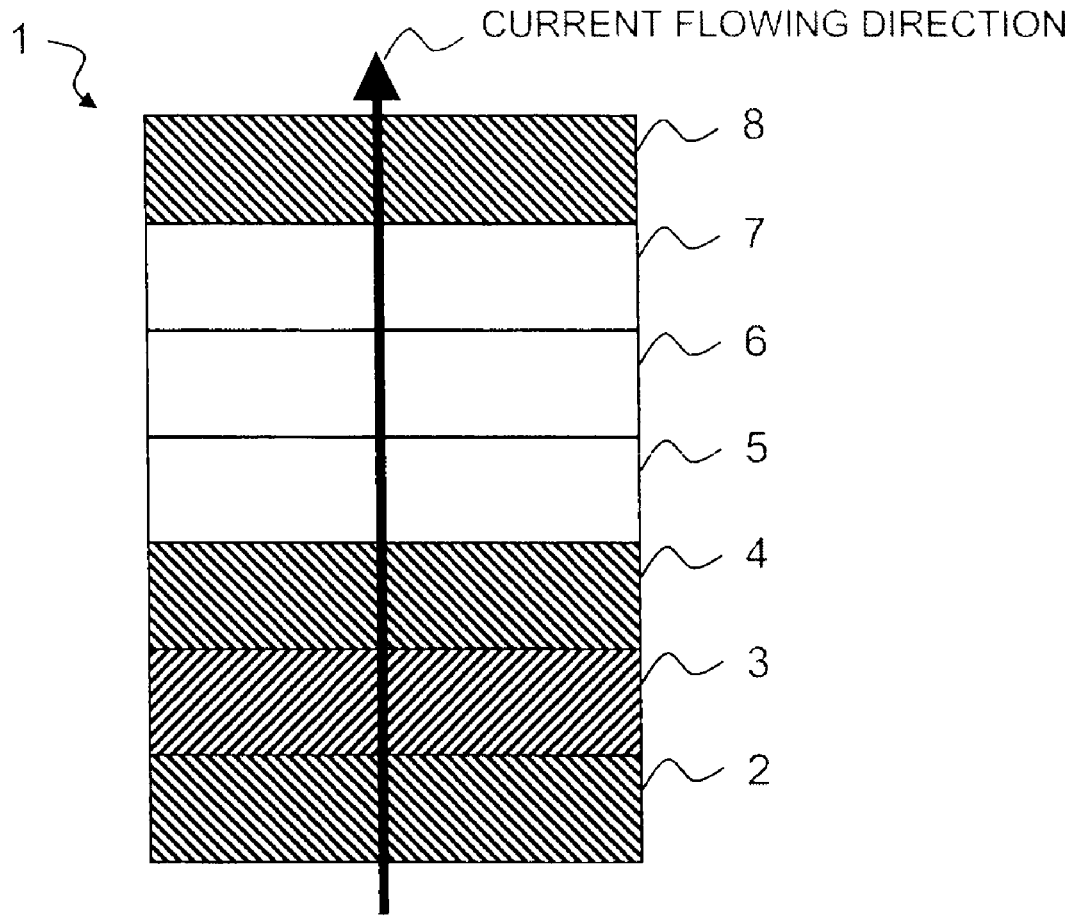
FIG. 1 is a view showing a magnetoresistive element 1 according to a first embodiment.

FIG. 1 is a view showing a magnetoresistive element 1 according to a first embodiment.

The magnetoresistive element 1 includes a nonmagnetic layer 6 sandwiched between a magnetization fixed layer 5 and a magnetization free layer 7. Hereinafter, the magnetization fixed layer and the magnetization free layer are referred to simply as the "fixed layer" and the "free layer", respectively. An electrode 8 is formed on the free layer 7. Moreover, a metal layer 4, a metal layer 3 and an electrode 2 are formed in series under the fixed layer 5. In addition, both the fixed layer 5 and the free layer 7 are ferromagnetic. That is, the fixed layer 5 and the free layer 7 differ from each other in that the magnetization of the fixed layer 5 is fixed in a direction and the magnetization direction of the free layer 7 varies in response to an external magnetic field.

A NiFe alloy, Cu, etc. can be employed for the electrode 8 and the electrode 2, for example. The thicknesses of the electrode 8 and the electrode 2 are 200 nm, for example.

$Al_2O_3$, $SiO_2$, etc. can be employed for the nonmagnetic layer 6, for example. The thickness of the nonmagnetic layer 6 is 1 nm, for example.

Au can be employed for the metal layer 4. A CuNi alloy can be employed for the metal layer 3. A current is passed from the metal layer 3 toward the metal layer 4. Passing the current through the structure mentioned above allows it to cool the interface between the metal layer 3 and the metal layer 4 owing to the Peltier effect. The thicknesses of the metal layer 4 and the metal layer 3 are not less than 5 nm and not more than 20 nm.

Figure 2:
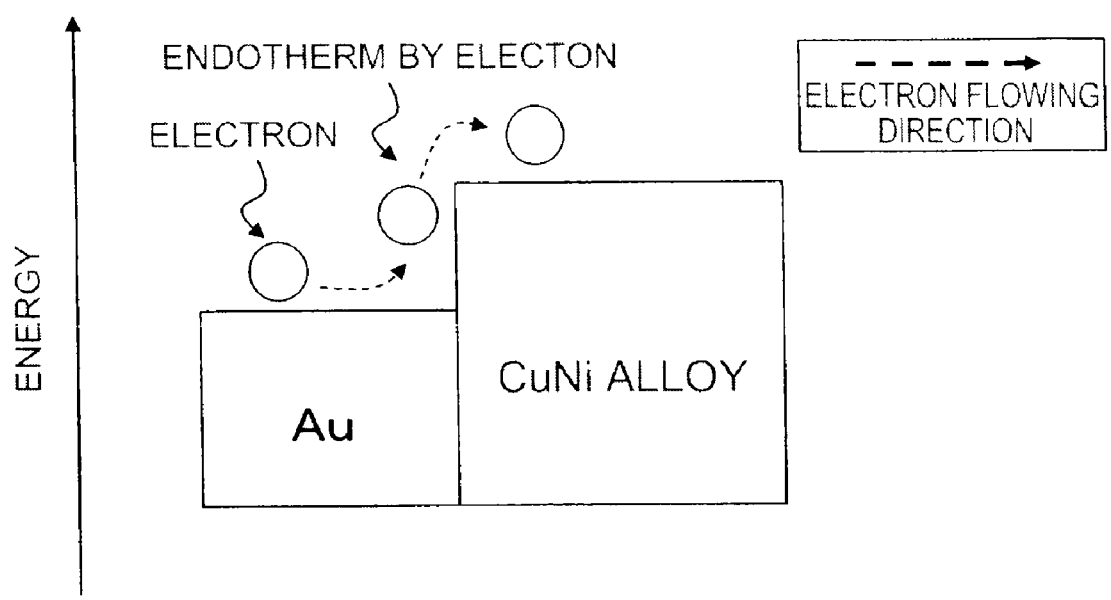
FIG. 2 is a view to explain a Peltier effect.

FIG. 2 is a view to explain the Peltier effect. The vertical axis represents the energy which a material has. A current flows leftward, and an electron flows rightward on the plane of the drawing. FIG. 2 shows an electron flows. As shown in FIG. 2, the Peltier effect reacts endothermically when the electron moves from the layer including Au to the layer including a CuNi alloy. Moreover, a large Peltier coefficient is obtained at the interface between the layer including Au and the layer including a CuNi alloy. It is known that the temperature is decreased at the interface by 200K (see, for example, the $70^{th}$ national fall meeting of The Japan Society of Applied Physics 10a-ZD-16 (2009)). Therefore, in order to utilize the cooling effect of the Peltier effect, what is necessary is just to pass an electron flow from the layer including Au to the layer including a CuNi alloy, that is, to pass a current from the layer including a CuNi alloy to the layer including Au.

Alternatively, the metal layers 3 and 4 may serve as a protective film, an underlayer or an electrode.

A half metal can be employed for at least one of the fixed layer 5 and the free layer 7. The thicknesses of the fixed layer 5 and the free layer 7 are 4 nm, for example.

Figure 3:
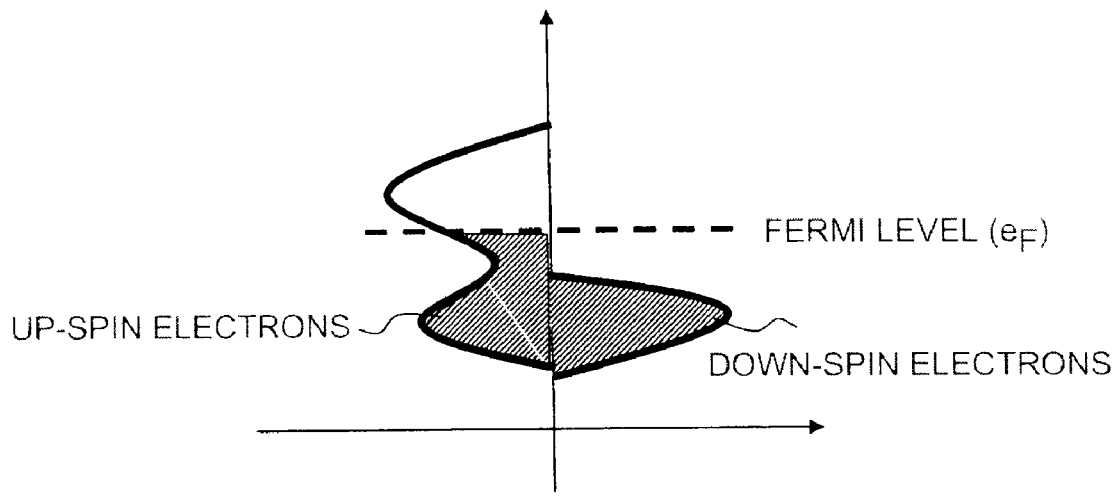
FIG. 3 is a view to explain a half metal.
Figure 3:
Figure 3:
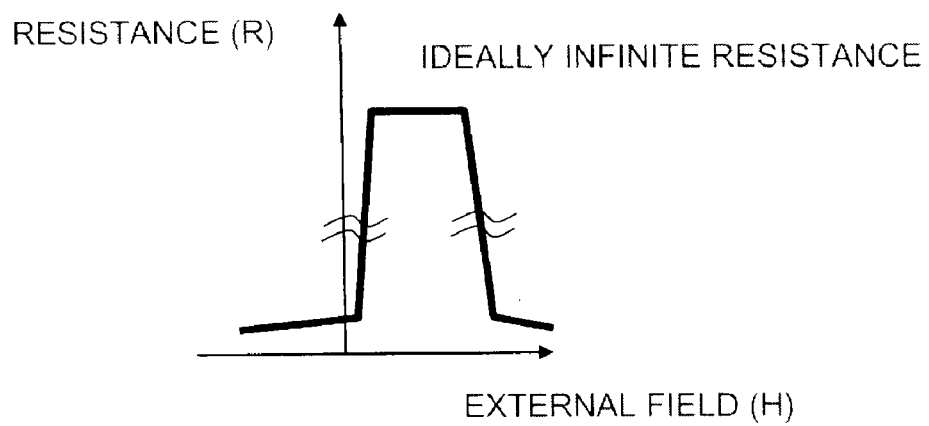

FIG. 3 is a view to explain a half metal. The upper drawing of FIG. 3 is a view showing a density of states for electrons of the half metal. The lower drawing of FIG. 3 is a view showing a response to an external magnetic field of the half metal.

As shown in the upper drawing of FIG. 3, a half metal is referred to as a ferromagnetic material where only up-spin electrons exist at a Fermi level and no down-spin electrons at the Fermi level. Only electrons at the Fermi level contribute to conduction. Therefore, only the up-spin electrons contribute to conduction, whereas the half metal is regarded as an insulator regarding the down-spin electrons. An MR change is caused in accordance with the difference between the electrical resistances due to the up-spin electrons and due to the down-spin electrons. Therefore, the MR change rate will become infinite to an external magnetic field if an ideal half metal is produced as shown in the lower drawing of FIG. 3. That is, materializing an electron state of the half metal approximately will cause a giant MR change rate.

Most materials of half metals have a Curie temperature (Curie point: Tc) lower than room temperature, thereby requiring the materials to be cooled down to low temperatures to obtain electron states of the half metals. Moreover, an ideal electron state of a half metal is normally estimated at absolute zero (0K). Consequently, it is important to cool a material predicted to be a half metal down to as low temperatures as possible in order to extract a half metal property.

Even a TMR (Tunneling Magneto-Resistance) element or a CPP (Current Perpendicular to Plane)-GMR element employing conventional ferromagnetic layers tends to increase its MR change rate at low temperatures, but the MR change rate at low temperatures is at most 5 times as much as that at room temperature. This increasing rate is regarded as a small one compared with the half metal whose MR change rate is expected to be infinite ideally.

The magnetoresistive element 1 in accordance with this embodiment allows it to obtain a large cooling effect based on the Peltier effect between the metal layer 4 and the metal layer 3. Therefore, the fixed layer 5 or the free layer 7 including a half metal can be cooled, thereby allowing it to obtain a high MR change rate.

Specific examples of the half metal include perovskite systems such as $La_{1-x}Sr_xMnO_3$ (0<x<1) and $Sr_2FeMoO_6$, magnetic semiconductors such as CrAs, (Ga, Mn, Cr)As, (Ga, Cr)As, (Ga, Mn)As, (Ga, Mn)N, (Zn, Mn)O and $CrO_2$, spinel systems such as $Fe_3O_4$ and $(Fe, Cr)_3O_1$, Heusler alloys such as NiMnSb, CoMnGe, CoMnAl and CoMnSi. These half metals show a high MR change rate at a low temperature of about 10K. However, the MR change rates of these half metals decrease significantly with increasing the ambient temperature thereof, thereby leading to a problem, i.e., a drastic reduction in the MR change rate of the magnetic elements at room temperature or at higher temperature.

However, in the magnetoresistive element 1 in accordance with this embodiment, a cooling effect of 200K can be obtained, thereby causing a practical MR change rate which is not ideal but sufficient. Alternatively, employing a half metal for either one of the two layers, i.e., the fixed layer 5 and the free layer 7, allows it to employ a FeCo alloy for the other. Then, a lamination structure of a FeCo alloy and the half metal may be employed for the fixed layer 5 or the free layer 7. Or, a lamination structure of a NiFe alloy and the half metal may be employed for the fixed layer 5 or the free layer 7. Such a lamination structure results in a linear change in the MR change of the magnetoresistive element 1 in response to an external magnetic field, thereby reducing a magnetic noise.

Next, an operating principle of the magnetoresistive element 1 in accordance with this embodiment will be explained below.

As shown in FIG. 1, a current is passed from the electrode 2 toward the electrode 8. Then, a cooling effect is caused between the metal layer 3 including a CuNi alloy and the metal layers 4 including Au. The fixed layer 5 or the free layer 7 which includes the half metal is cooled by the cooling effect. At this time, either one of an up-spin electron and a down-spin electron becomes major in the fixed layer 5 or the free layer 7 which includes the half metal. Therefore, when the magnetoresistive element 1 receives an external magnetic field, the magnetization of the free layer 7 rotates to interact with the magnetization fixed in a prescribed direction in the fixed layer 5, thereby causing a high MR change rate.

The cooling phenomenon due to the Peltier effect has been already used for a cooler box or cooling inside a personal computer, etc. However, a large area junction is then used to cause the cooling effect as much as possible. The magnetoresistive element having a size of tens of nanometers limits the cooling effect owing to its small junction area in comparison with conventional practical applications. However, it is unveiled that a magnetoresistive element is downsized to increase the cooling effect (see, for example, J. Appl. Phys. 99, 08H706 (2006)). Therefore, it is useful to employ the Peltier effect to the magnetoresistive element 1 in accordance with this embodiment.

Alternatively, the fixed layer 5 and the free layer 7 switch places with each other.

First Modified Example

Figure 4:
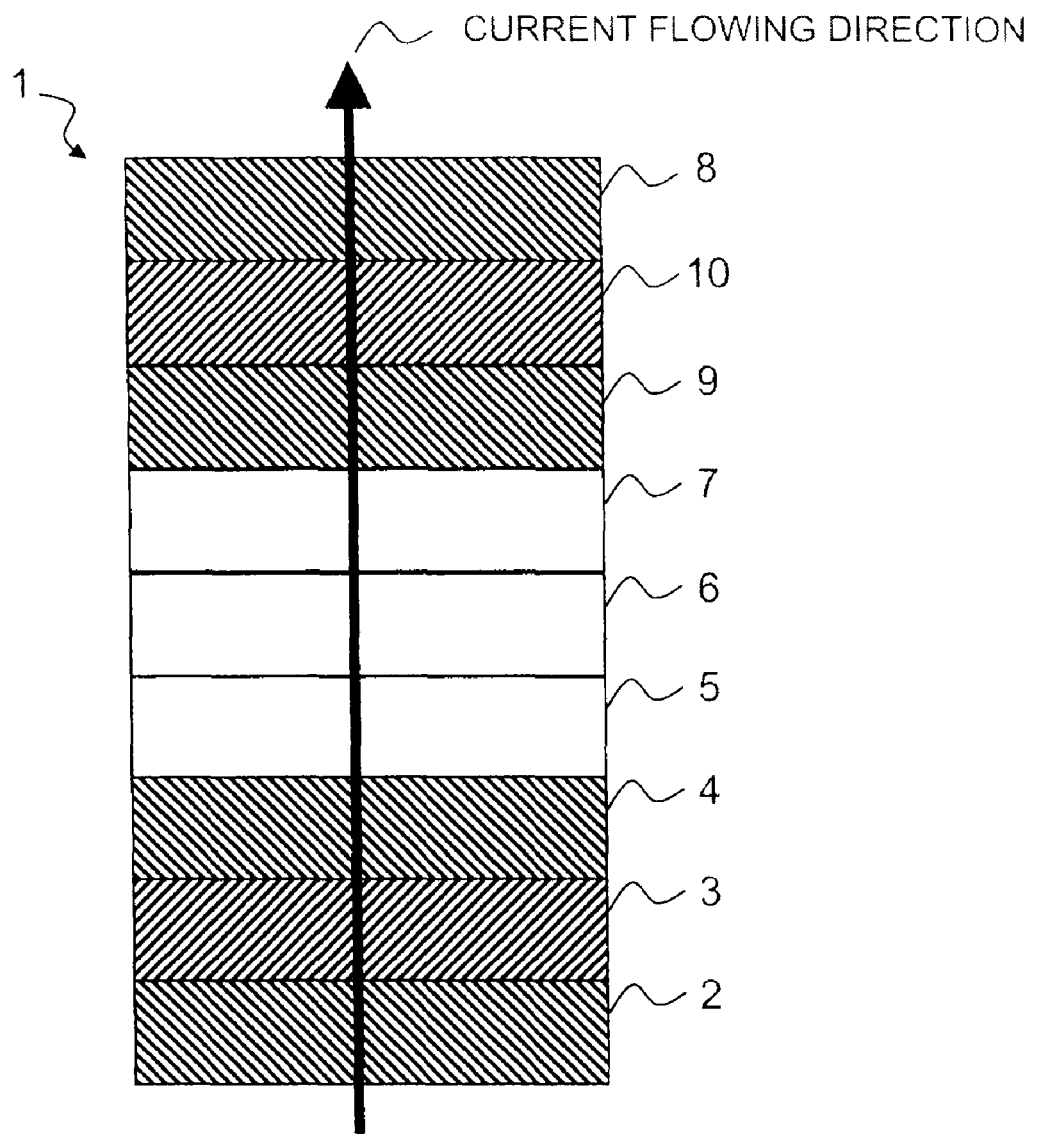
FIG. 4 is a view showing a first modified example of a magnetoresistive element in accordance with the first embodiment.

FIG. 4 is a view showing a first modified example of the magnetoresistive element 1 in accordance with the first embodiment. The first modified example is different from the magnetoresistive element 1 in accordance with the first embodiment in that a metal layer 9 including a CuNi alloy is provided between the free layer 7 and the electrode 8, and a metal layer 10 including Au is provided between the metal layer 9 and the electrode 8. A cooling effect due to the Peltier effect can be caused also between the metal layer 9 and the metal layer 10. Therefore, the modified example has a higher MR change rate than the magnetoresistive element 1 in accordance with the first embodiment.

Alternatively, the fixed layer 5 and the free layer 7 switch places with each other.

Second Modified Example

Figure 5:
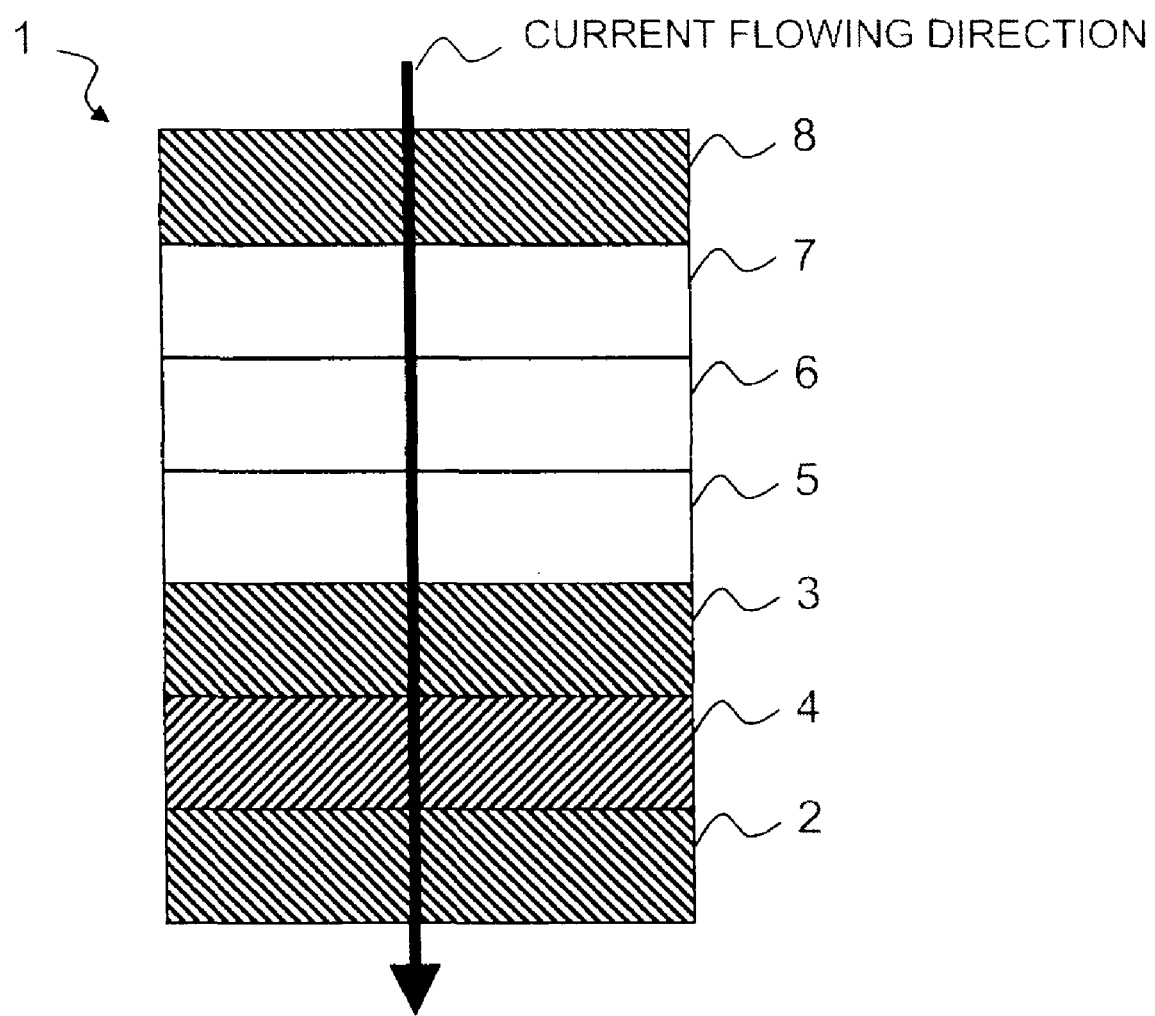
FIG. 5 is a view showing a modified example of the magnetoresistive element in accordance with the first embodiment.

FIG. 5 is a view showing a second modified example of the magnetoresistive element 1 in accordance with the first embodiment. The second modified example differs from the magnetoresistive element 1 in accordance with the first embodiment in that the metal layer 4 and the metal layer 3 have switched places with each other. In this case, a current is passed from the electrode 8 toward the electrode 2.

Alternatively, the fixed layer 5 and the free layer 7 may switch places with each other.

Second Embodiment

Figure 6:
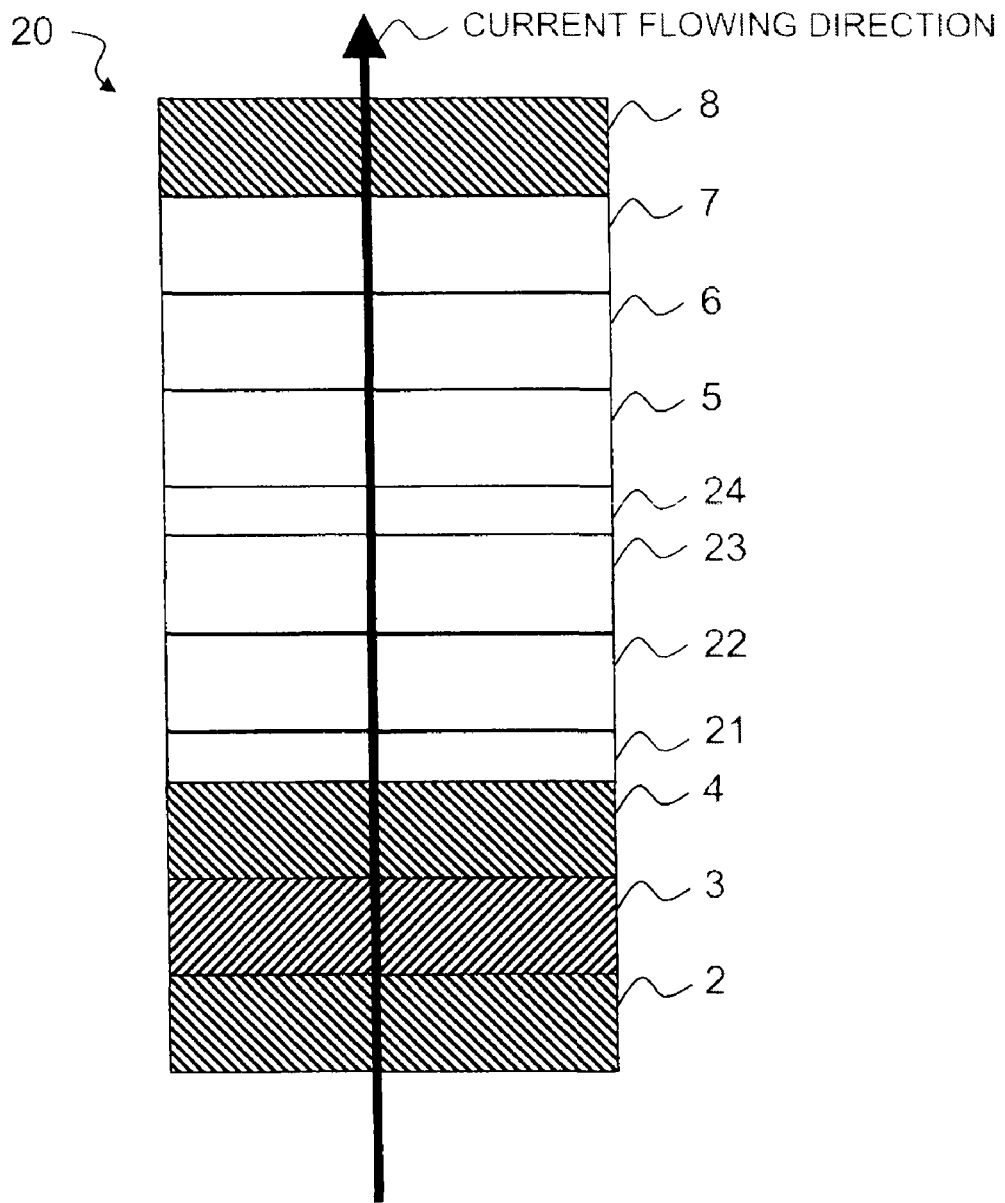
FIG. 6 is a view showing a magnetoresistive element in accordance with a second embodiment.

FIG. 6 is a view showing a magnetoresistive element 20 in accordance with a second embodiment.

The magnetoresistive element 20 in accordance with the second embodiment differs from the magnetoresistive element 1 in accordance with the first embodiment in that the underlayer 21, the antiferromagnetic layer 22, the ferromagnetic layer 23, and the intermediate layer 24 are provided on the metal layer 4. Here, an explanation of the same points as the first embodiment is omitted.

The underlayer 21 can enhance a crystalline orientation of the antiferromagnetic layer 22. Ta and Ru can be employed for the underlayer 21, for example. The thickness of the underlayer 21 is not less than 2 nm and not more than 3 nm, for example.

The antiferromagnetic layer 22 fixes the magnetization of the ferromagnetic layer 23. IrMn can be employed for the antiferromagnetic layer 22, for example.

The magnetization of the ferromagnetic layer 23 is fixed in a prescribed direction by the antiferromagnetic layer 22. A FeCo alloy can be employed for the ferromagnetic layer 23, for example. The thickness of the ferromagnetic layer 23 is 4 nm, for example.

The intermediate layer 24 is employed to antiferromagnetically couple the ferromagnetic layer 23 and the fixed layer 5 with each other. Ru can be employed for the intermediate layer 24, for example. The thickness of the intermediate layer 24 is 1 nm, for example.

According to the magnetoresistive element 20 in accordance with the second embodiment, the magnetization of the fixed layer 5 is fixed more firmly, thereby allowing it to obtain a higher MR change rate.

Moreover, it is known that the fixing power of the antiferromagnetic layer 22 to fix the magnetization of the ferromagnetic layer 23 will be dependent on temperatures. The lower the ambient temperature of the antiferromagnetic layer 22 is, the higher the magnetization-fixing power is. Therefore, lower temperature leads to more stable magnetization, thereby controlling magnetic noise and enhancing reliability of the magnetic devices. Although the antiferromagnetic layer 22 is made thin to reduce the magnetization-fixing power, the cooling effect due to the Peltier effect can compensate the magnetization-fixing power. This is because the regularity of magnetization increases with lowering the ambient temperatures. This allows it to thin the antiferromagnetic layer 22 while maintaining or enhancing the magnetization-fixing power.

A high storage density of HDD (Hard Disk Drive) requires the downsizing of the whole magnetoresistive element. Although the thickness of the antiferromagnetic layer 22 is required to be at least 7 nm, the antiferromagnetic layer 22 in particular can be made as thin as not less than 3 nm and not more than 5 nm. Therefore, thinning the antiferromagnetic layer is effective for a future magnetoresistive element for high storage density.

In addition, FIG. 6 shows that the underlayer 21, the antiferromagnetic layer 22, the ferromagnetic layer 23, the intermediate layer 24, the fixed layer 5, the nonmagnetic layer 6 and the free layer 7 are formed on the metal layer 4 in this order. Alternatively, the free layer 7, the nonmagnetic layer 6, the fixed layer 5, the intermediate layer 24, the ferromagnetic layer 23, the antiferromagnetic layer 22 and the underlayer 21 may be formed on the metal layer 4 in the reverse order.

Third Modified Example

Figure 7:
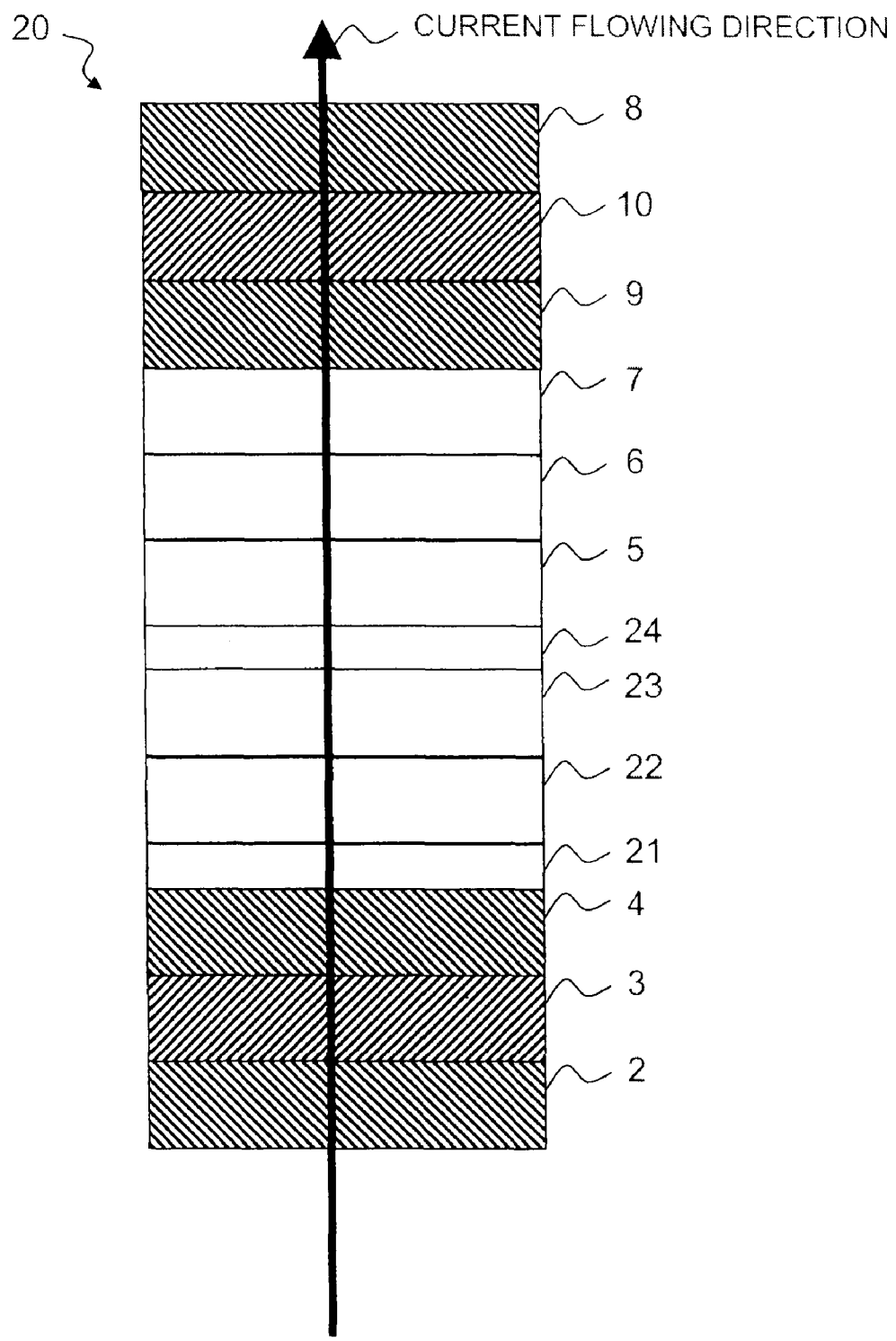
FIG. 7 is a view showing a modified example of the magnetoresistive element in accordance with the second embodiment.

FIG. 7 is a view showing a third modified example of the magnetoresistive element 20 in accordance with the second embodiment. The third modified example differs from the magnetoresistive element 20 in accordance with the second embodiment in that the metal layer 9 is provided between the free layer 7 and the electrode 8, and the metal layer 10 is provided between the metal layer 9 and the electrode 8.

In addition, FIG. 7 shows that the underlayer 21, the antiferromagnetic layer 22, the ferromagnetic layer 23, the intermediate layer 24, the fixed layer 5, the nonmagnetic layer 6 and the free layer 7 are formed on the metal layer 4 in this order. Alternatively, the free layer 7, the nonmagnetic layer 6, the fixed layer 5, the intermediate layer 24, the ferromagnetic layer 23, the antiferromagnetic layer 22 and the underlayer 21 may be formed on the metal layer 4 in the reverse order.

Fourth Modified Example

Figure 8:
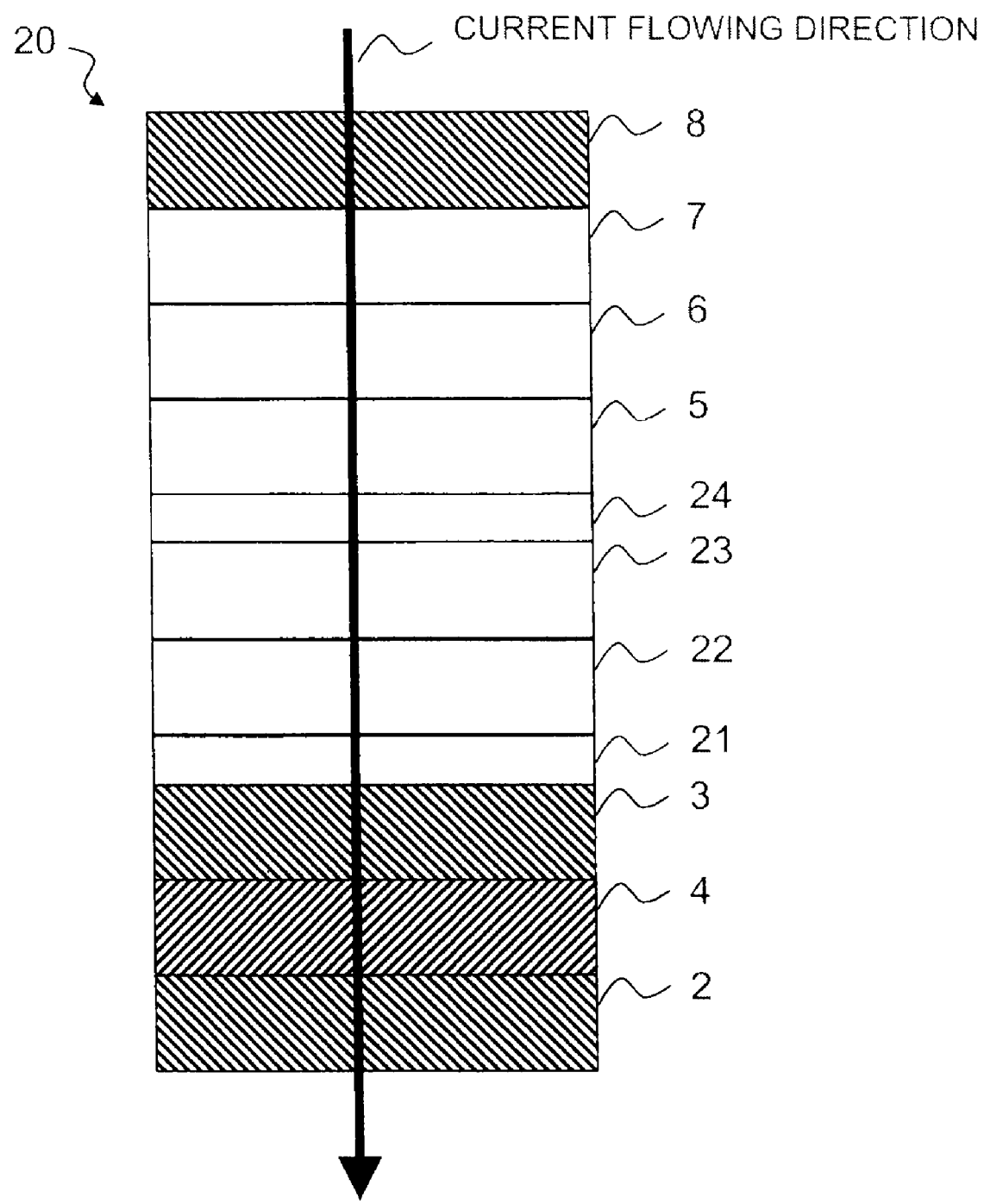
FIG. 8 is a view showing another modified example of the magnetoresistive element in accordance with the second embodiment.

FIG. 8 is a view showing a fourth modified example of the magnetoresistive element 20 in accordance with the second embodiment. The fourth modified example differs from the magnetoresistive element 20 in accordance with the second embodiment in that the metal layer 4 and the metal layer 3 have switched places with each other. In this case, a current is passed from the electrode 8 toward the electrode 2.

In addition, FIG. 8 shows that the underlayer 21, the antiferromagnetic layer 22, the ferromagnetic layer 23, the intermediate layer 24, the fixed layer 5, the nonmagnetic layer 6 and the free layer 7 are formed on the metal layer 3 in this order. Alternatively, the free layer 7, the nonmagnetic layer 6, the fixed layer 5, the intermediate layer 24, the ferromagnetic layer 23, the antiferromagnetic layer 22 and the underlayer 21 may be formed on the metal layer 3 in the reverse order.

Third Embodiment

Figure 9:
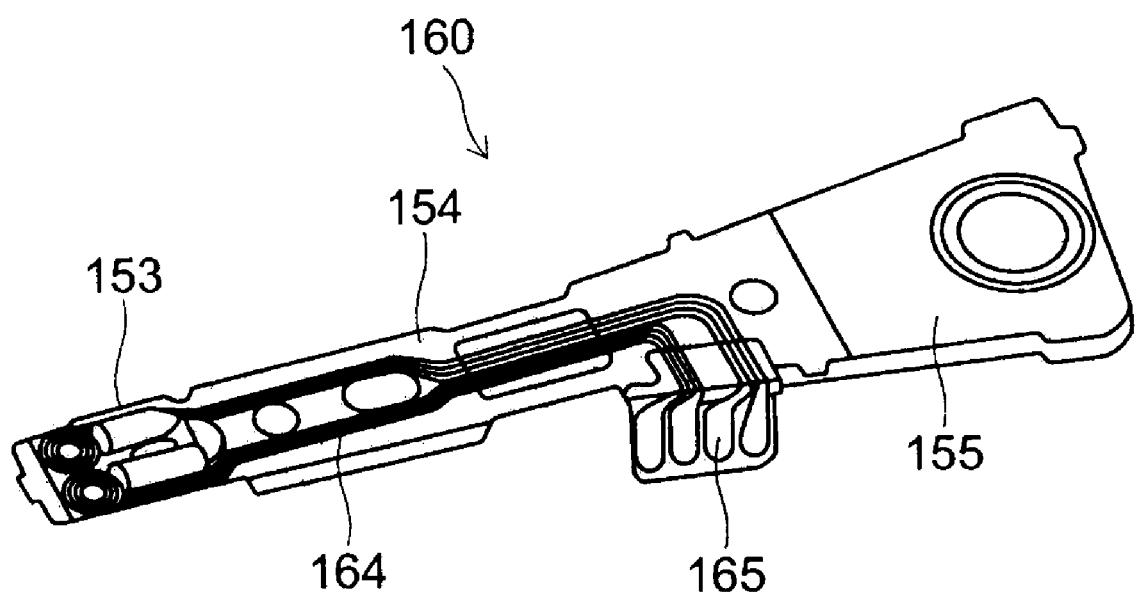
FIG. 9 is a perspective view illustrating a composition of a magnetic head assembly in accordance with a third embodiment.

FIG. 9 is a perspective view illustrating a composition of a magnetic head assembly in accordance with a third embodiment.

As shown in FIG. 9, the magnetic head assembly (head gimbal assembly) 160 in accordance with this embodiment is provided with a suspension 154 and an actuator arm 155. The suspension 154 carries the magnetoresistive element in accordance with the first or second embodiment at one end thereof. The actuator arm 155 is connected to the other end of the suspension 154. Here, the magnetoresistive element is selected as at least one of the magnetoresistive elements 1 and 20.

That is, the head gimbal assembly 160 has the actuator arm 155, and the suspension 154 is connected to the one end of the actuator arm 155. A head slider 153 having a magnetic head is mounted onto the tip of the suspension 154. The magnetic head includes the magnetoresistive element in accordance with the first or second embodiment.

The suspension 154 has leads 164 for writing and reading of signal, and the leads 164 are connected electrically to the respective electrodes of the magnetic head built in the head slider 153. Electrode pads 165 are provided to the head gimbal assembly 160.

The magnetic head assembly in accordance with the third embodiment has a magnetic head including the magnetoresistive element in accordance with the first or second embodiment, thereby enabling it to provide a magnetic head assembly with a high MR change rate.

Fourth Embodiment

Figure 10:
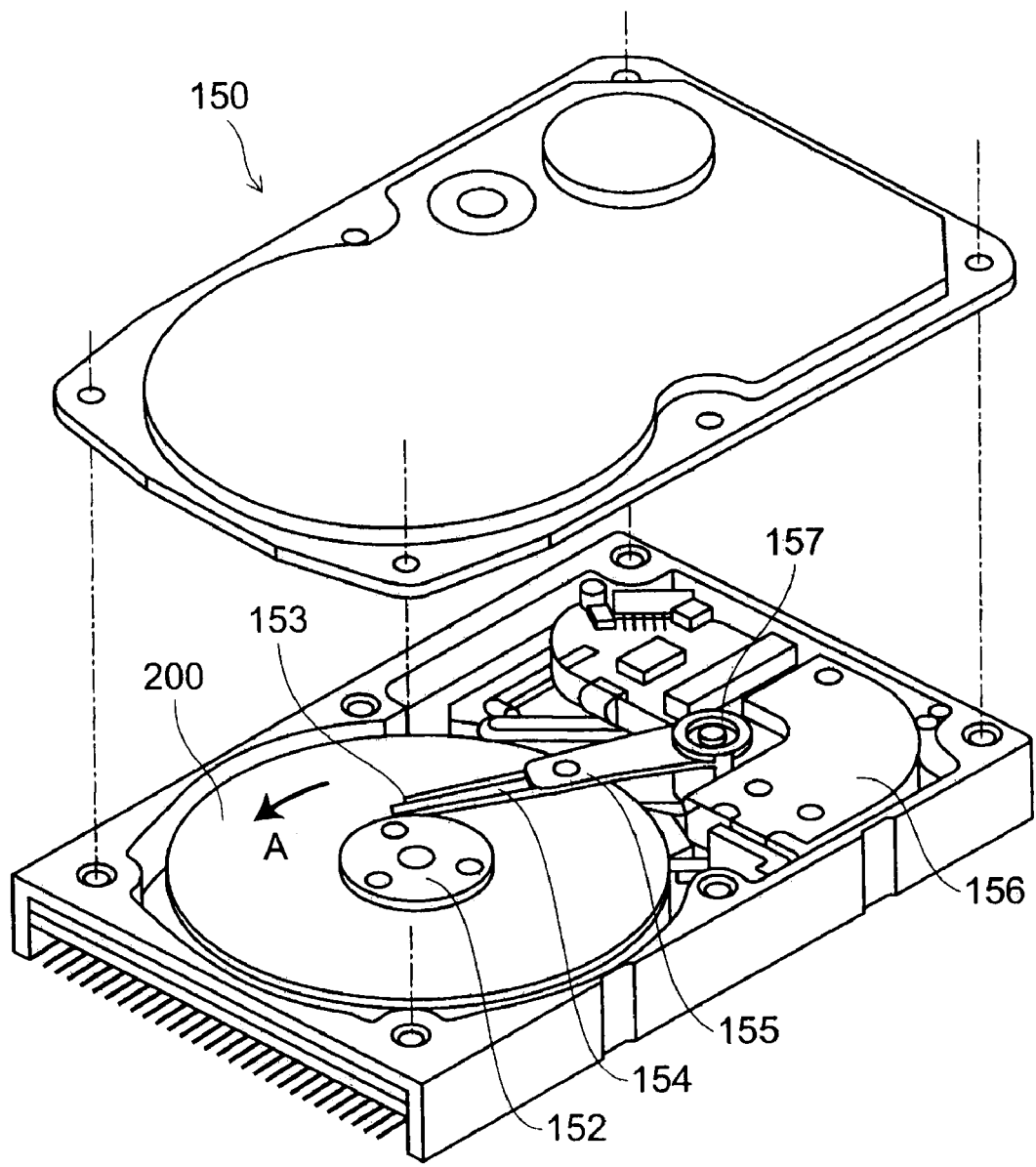
FIG. 10 is a perspective view illustrating a composition of a magnetic recording/reproducing apparatus in accordance with a fourth embodiment.

FIG. 10 is a perspective view illustrating a composition of a magnetic recording/reproducing apparatus in accordance with a fourth embodiment.

As shown in FIG. 10, the magnetic recording apparatus 150 in accordance with this embodiment is a system employing a rotary actuator. In FIG. 10, a spindle motor 152 is provided with a recording medium disk 200, and rotates in a direction shown by an arrow A using a motor (not shown) which responds to a control signal from a drive control unit (not shown). The magnetic recording/reproducing apparatus 150 in accordance with this embodiment may be provided with two or more magnetic disks 200.

The magnetic recording/reproducing apparatus 150 is provided with the magnetic head assembly 160 in accordance with the third embodiment.

The head slider 153 performs recording/reproducing information to be stored on the recording medium disk 180, and is mounted onto the tip of the filmy suspension 154.

The suspension 154 is connected to an end of the actuator arm 155. A voice coil motor 156, i.e., a kind of a linear motor is provided to the other end of the actuator arm 155. A voice coil motor 156 includes a drive coil (not shown) and a magnetic circuit. The drive coil is wound up onto the bobbin of the actuator arm 155. The magnetic circuit includes a permanent magnet and a facing yoke to sandwich the coil.

The recording medium disk 200 rotates so that an airbearing surface of the head slider 153 is suspended above the surface of the recording medium disk 200 with a prescribed flying height. Alternatively, the head slider 153 may be in contact with the recording medium disk 200, which is called a "contact run type".

The actuator arm 155 is suspended by ball bearings (not shown) which are provided on both the upper and lower sides of a bearing portion 157, and can rotate slidably owing to the voice coil motor 156.

The magnetic recording/reproducing apparatus 150 in accordance with this embodiment employs the head gimbal assembly 160 which has a magnetic head including the magnetoresistive element in accordance with the first or second embodiment, thereby allowing it to firmly read out information stored on the magnetic disk 200 of high storage density owing to a high MR change rate.

Fifth Embodiment

As a magnetic recording/reproducing apparatus in accordance with a fifth embodiment, a magnetic memory provided with the magnetoresistive element in accordance with the first or second embodiment will be explained below. That is, magnetic memories, such as a magnetic random access memory (MRAM: magnetic random access memory) with memory cells arranged in a matrix, are enabled using the magnetoresistive element in accordance with the first or second embodiment. The magnetoresistive element in accordance with the first embodiment is assumed to be employed for the magnetoresistive element below. The magnetoresistive element mentioned above can be also employed.

Figure 11:
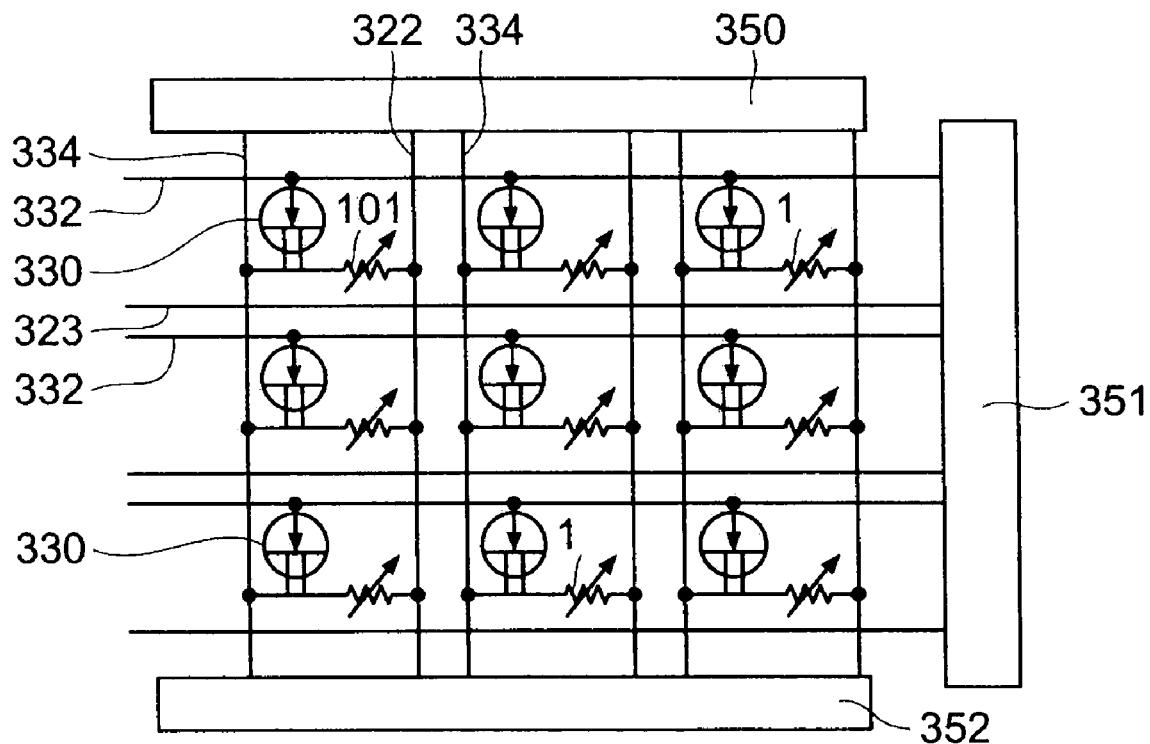
FIG. 11 is a diagram showing a composition of a magnetic recording/reproducing apparatus in accordance with a fifth embodiment.

FIG. 11 is a diagram showing a composition of a magnetic recording/reproducing apparatus in accordance with the fifth embodiment.

That is, FIG. 11 illustrates a circuit configuration of memory cells arranged in an array. As shown in FIG. 11, the magnetic memory in accordance with the fifth embodiment is provided with a column decoder 350 and a row decoder 351 to select a cross point (a bit) therein. Only one switching transistor 330 is selected by a bit line 334 and a word line 332 to be switched on, thereby allowing it to detect a current passing through the magnetoresistive element using a sense amplifier 352 and to read out the bit information stored in the free layer 7 of the magnetoresistive element.

On the other hand, when performing write-in of bit information, a current is passed through a specific write-in word line 323 and a specific write-in bit line 322 to generate a write-in magnetic field and to apply the write-in magnetic field to the free layer 7.

Figure 12:
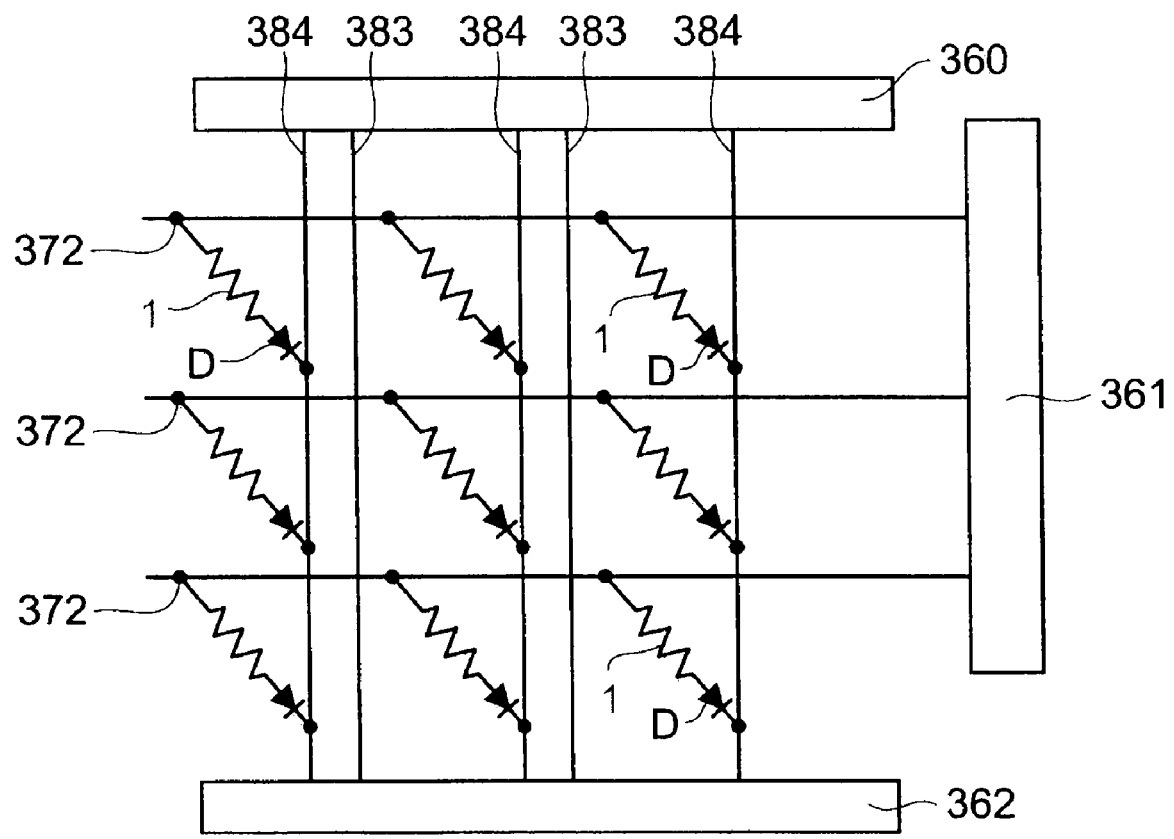
FIG. 12 is a diagram illustrating another composition of the magnetic recording/reproducing apparatus in accordance with the fifth embodiment.

FIG. 12 is a diagram illustrating another composition of the magnetic recording/reproducing apparatus in accordance with the fifth embodiment.

As shown in FIG. 12, both the bit line 372 and the word line 384 wired in a matrix are selected by the decoders 360, 361 and 362, thereby allowing it to select a specific memory cell in the array. Each memory cell has a structure where the magnetoresistive element 1 and a diode D are connected with each other in series. Here, the diode D prevents a sense current from bypassing any memory cells other than the selected memory cell including the magnetoresistive element 1. Respective writing currents are passed through the specific bit line 372 and word line 383 independently to generate a magnetic field for writing.

Figure 13:
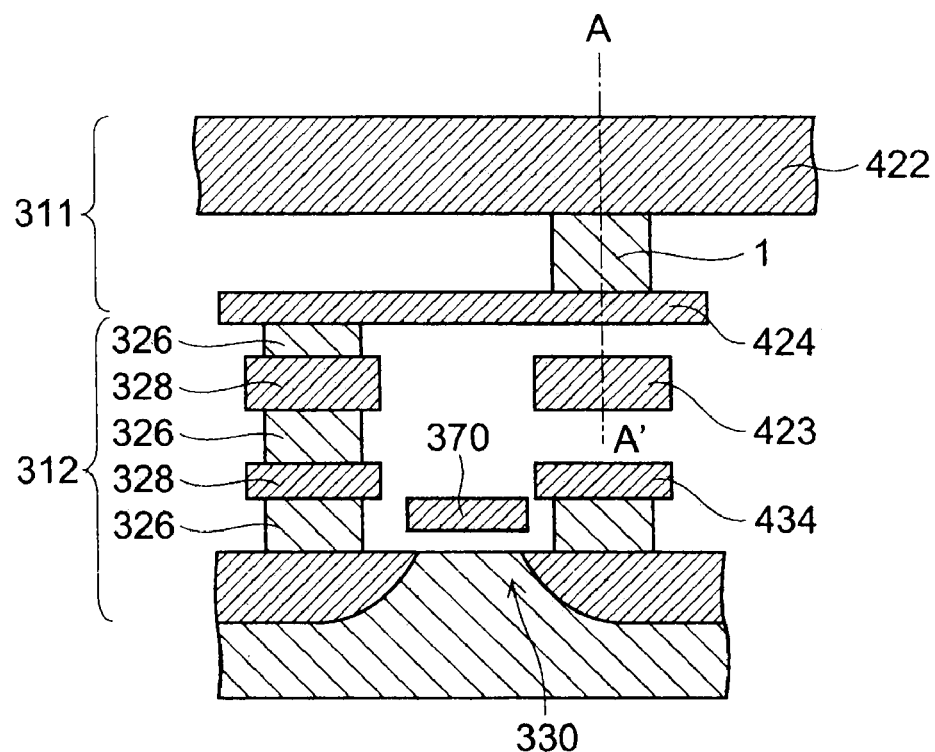
FIG. 13 is a typical sectional view illustrating a main part of the magnetic

FIG. 13 is a typical sectional view illustrating a main part of the magnetic recording/reproducing apparatus in accordance with the fifth embodiment.

Figure 14:
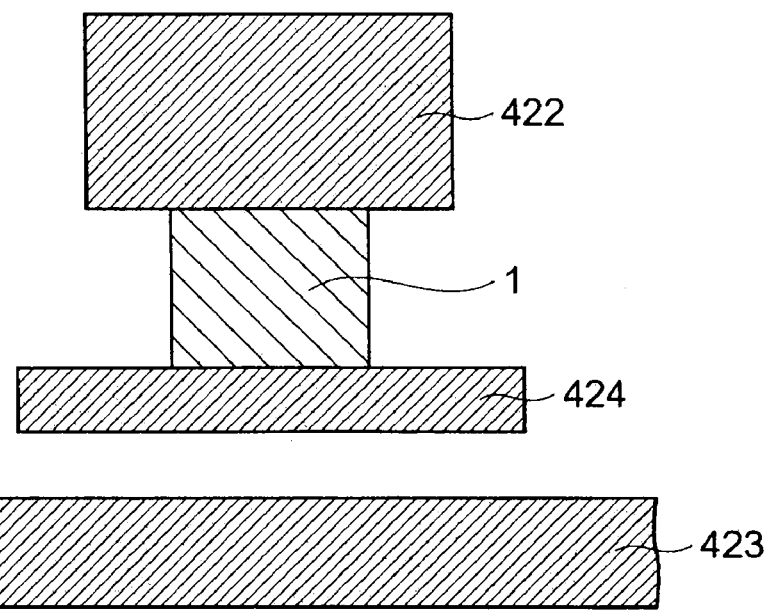
FIG. 14 is a sectional view cut along the broken line XIV-XIV line in FIG. 13.

FIG. 14 is a sectional view cut along the broken line XIV-XIV line in FIG. 13.

FIGS. 13 and 14 illustrate a structure of the one-bit memory cell included in the magnetic recording/reproducing apparatus (magnetic memory) shown in FIG. 11. This memory cell includes a storage cell 311 and a transistor 312 for address selection.

The storage cell 311 has the magnetoresistive element 1, and a pair of lines 422, 424 which are connected to the magnetoresistive element 1. The magnetoresistive element 1 is one magnetoresistive element in accordance with the embodiments mentioned above.

On the other hand, the transistor 312 for address selection is provided with the switching transistor 330 connected through a via hole 326 and a buried line 328 thereto. The switching transistor 330 switches a current pass between the magnetoresistive element 101 and the line 434 in response to a voltage applied to a gate 370.

In addition, a writing line 423 is provided in a direction substantially vertical to a line 422 under the magnetoresistive element 1. These lines 422, 423 can be formed employing an alloy including Al, Cu, W or Ta, for example.

The lines 422 and 423 correspond to the bit line 322 and the word line 323, respectively.

Writing is performed in such a memory cell in the following way. Respective writing pulse currents are passed through the lines 422, 423 to write bit information in the magnetoresistive element 1, and form a superposed magnetic field of two magnetic field generated by the respective writing pulse currents. The superposed magnetic field is applied to the recording layer of the magnetoresistive element to switch the magnetization of the recording layer.

Reading is performed as follows. A sense current is passed through the line 422, the magnetoresistive element 1 including the magnetic record layer and the line 424 to estimate the resistance or resistance change of the magnetoresistive element 1.

The magnetic memory in accordance with the embodiments employing the magnetoresistive element in accordance with the embodiments mentioned above enables it to firmly perform write-in and read-out by firmly controlling magnetic domains of the recording layer and by firmly writing on the recording layer, even though the memory cell is downsized.

Embodiments are not limited to the embodiments described above, and can be expanded and modified to be included in the invention. One skilled in the art can choose a specific layer structure, or the shape or the material of electrodes, biasing layers or insulator layers for the magnetoresistive elements to obtain similar effects. For example, when applying the magnetoresistive element to a magnetic reproducing head, magnetic shields may be provided on the upper and lower surfaces of the element to control the reproduction resolution of the magnetic head.

The embodiments described above can be applied to not only a longitudinal magnetic recording system but a perpendicular one. Furthermore, the magnetic reproducing apparatus may be a "stationary type" regularly provided with a specific recording medium or a "removable type" for which a recording medium can be replaced.

As described above, the embodiments have been explained. However, the invention is not limited to these specific examples. For example, a manufacturing process of the magnetoresistive element, and specific structures of the magnetoresistive element, the magnetic head assembly and the magnetic recording/reproducing apparatus are included in the scope of the invention as long as one skilled in the art can reduce to practice of the invention by properly choosing various factors from a publicly known range to obtain a similarly advantageous effect of the invention.

Moreover, what combined two or more factors of the examples in a technically possible range is included in the scope of the invention as long as the subject matter of the invention is included therein.

While certain embodiments of the invention have been described, these embodiments have been presented by way of example only, and are not intended to limit the scope of the inventions. Indeed, the novel elements and apparatuses described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

Alternatively, the CCP-GMR effect film or the TMR effect film may be employed for the magnetoresistive elements 1 and 20 in accordance with the respective embodiments.

The magnetoresistive elements using a spin valve film include a CIP (Current In Plane)-GMR element, a TMR element and a CPP-GMR element. A CIP-GMR element was first put to practical use among them. The CIP-GMR element is a type with a sense current passed through the film plane thereof and is suitable for a large magnetic head. However, heat generation has become problematic as the elements are downsized with the increase in the recording density of HDD. For this reason, the TMR elements with a sense current passed perpendicularly through the film plane were then put to practical use. A TMR element needs a small sense current, and outputs a large output. However, the TMR element generally has a high resistance due to a tunnel current passing through the insulating barrier thereof. At present, a high MR change rate has not yet been obtained which compensates the disadvantageous high resistance. A CPP-GMR element is proposed to avoid this disadvantage. The CPP-GMR element generally has a low resistance owing to the magnetoresistive effect based on metallic conduction to be advantageous to the TMR element. However, it is difficult for a metal CPP-GMR element to transduce a subtle magnetic field into an electric signal because the metal CPP-GMR element is made basically from metal layers causes a small amount of resistance change due to magnetization switching. The subtle magnetic field means a magnetic field on a high density magnetic disk, for example.

As described above, the magnetoresistive elements 1 and 20 based on the Peltier effect and the half metal enables it to obtain a high MR change rate and give an answer for the TMR and CPP-GMR elements which are required to have much higher MR change rate.

As described above, according to the first embodiment, a magnetoresistive element includes a first ferromagnetic layer, a second ferromagnetic layer, a nonmagnetic layer, a first metal layer, a second metal layer, a first electrode, and a second electrode. The nonmagnetic layer is provided between the first ferromagnetic layer and the second ferromagnetic layer. The first metal layer includes Au and is provided so that the first ferromagnetic layer is sandwiched between the nonmagnetic layer and the first metal layer. The second metal layer includes a CuNi alloy, and is provided so that the first metal layer is sandwiched between the first ferromagnetic layer and the second metal layer. The first electrode is provided so that the second metal layer is sandwiched between the first metal layer and the first electrode. The second electrode is provided so that the second ferromagnetic layer is sandwiched between the nonmagnetic layer and the second electrode. In addition, magnetization of either one of the first ferromagnetic layer and the second ferromagnetic layer is fixed in a direction. Magnetization of the other is variable in response to an external field. At least one of the first ferromagnetic layer and the second ferromagnetic layer includes a half metal. An electric current is passed from the first electrode to the second electrode.

According to the first embodiment, another magnetoresistive element includes a first ferromagnetic layer, a second ferromagnetic layer, a nonmagnetic layer, a first metal layer, a second metal layer, a first electrode, and a second electrode. The nonmagnetic layer is provided between the first ferromagnetic layer and the second ferromagnetic layer. The first metal layer includes a CuNi alloy and is provided so that the first ferromagnetic layer is sandwiched between the nonmagnetic layer and the first metal layer. The second metal layer includes Au, and is provided so that the first metal layer is sandwiched between the first ferromagnetic layer and the second metal layer. The first electrode provided so that the second ferromagnetic layer is sandwiched between the nonmagnetic and the first electrode. The second electrode is provided so that the second metal layer is sandwiched between the first metal layer and the second electrode. In addition, magnetization of either one of the first ferromagnetic layer and the second ferromagnetic layer is fixed in a direction. Magnetization of the other is variable in response to an external field. At least one of the first ferromagnetic layer and the second ferromagnetic layer includes a half metal. An electric current is passed from the first electrode to the second electrode.

According to the second embodiment, a magnetoresistive element includes a first ferromagnetic layer, a second ferromagnetic layer, a nonmagnetic layer, an antiferromagnetic layer, a first metal layer, a second metal layer, a first electrode, and a second electrode. Magnetization of the first ferromagnetic layer is fixed in a direction. Magnetization of the second ferromagnetic layer is variable in response to an external magnetic field. The nonmagnetic layer is provided between the first ferromagnetic layer and the second ferromagnetic layer. The antiferromagnetic layer is provided so that the first ferromagnetic layer is sandwiched between the nonmagnetic layer and the antiferromagnetic layer. The first metal layer includes Au and is provided so that the antiferromagnetic layer is sandwiched between the first ferromagnetic layer and the first metal layer. The second metal layer includes a CuNi alloy and is provided so that the first metal layer is sandwiched between the antiferromagnetic layer and the second metal layer. The first electrode is provided so that the second metal layer is sandwiched between the first metal layer and the first electrode. The second electrode is provided so that the second ferromagnetic layer is sandwiched between the nonmagnetic layer and the second electrode. In addition, at least one of the first ferromagnetic layer and second ferromagnetic layer includes a half metal, and an electric current is passed from the first electrode to the second electrode.

According to the second embodiment, another magnetoresistive element includes a first ferromagnetic layer, a second ferromagnetic layer, a nonmagnetic layer, an antiferromagnetic layer, a first metal layer, a second metal layer, a first electrode, and a second electrode. Magnetization of the first ferromagnetic layer is fixed in a direction. Magnetization of the second ferromagnetic layer is variable in response to an external magnetic field. The nonmagnetic layer is provided between the first ferromagnetic layer and the second ferromagnetic layer. The antiferromagnetic layer is provided so that the first ferromagnetic layer is sandwiched between the nonmagnetic layer and the antiferromagnetic layer. The first metal layer includes Au and is provided so that the antiferromagnetic layer is sandwiched between the first ferromagnetic layer and the first metal layer. The second metal layer includes a CuNi alloy and is provided so that the first metal layer is sandwiched between the antiferromagnetic layer and the second metal layer. The first electrode is provided so that the second ferromagnetic layer is sandwiched between the nonmagnetic layer and the first electrode. The second electrode is provided so that the second metal layer is sandwiched between the first metal layer and the second electrode. In addition, at least one of the first ferromagnetic layer and second ferromagnetic layer includes a half metal, and an electric current is passed from the first electrode to the second electrode.

According to the third embodiment, a magnetic head assembly includes a suspension and an actuator arm. The suspension carries the magnetoresistive element in accordance with the first embodiment or the second embodiment at one end of the suspension, and the actuator arm is mounted onto the other end of the suspension.

According to the fourth embodiment, a magnetic recording/reproducing apparatus includes the magnetic head assembly in accordance with the third embodiment and a magnetic recording medium from which information is reproduced by the use of the magnetoresistive element.

What is claimed is:

1. A magnetoresistive element comprising:
a first ferromagnetic layer;
a second ferromagnetic layer,
a nonmagnetic layer to be provided between the first ferromagnetic layer and the second ferromagnetic layer;
a first metal layer which includes Au and is provided so that the first ferromagnetic layer is sandwiched between the nonmagnetic layer and the first metal layer;
a second metal layer which includes a CuNi alloy and is provided so that the first metal layer is sandwiched between the first ferromagnetic layer and the second metal layer;
a first electrode to be provided so that the second metal layer is sandwiched between the first metal layer and the first electrode; and
a second electrode to be provided so that the second ferromagnetic layer is sandwiched between the nonmagnetic layer and the second electrode,
wherein
magnetization of either one of the first ferromagnetic layer and the second ferromagnetic layer is fixed in a direction;
magnetization of the other is variable in response to an external field;
at least one of the first ferromagnetic layer and the second ferromagnetic layer includes a half metal; and
an electric current is passed from the first electrode to the second electrode.

2. The element according to claim 1, further comprising:
a third metal layer including a CuNi alloy, and being provided between the second electrode and the second ferromagnetic layer; and
a fourth metal layer including Au, and being provided between the second electrode and the third metal layer.

3. The element according to claim 1, wherein
the half metal is selected from the group consisting of $La_{1-x}Sr_xMnO3$ ($0<x<1$), $Sr_2FeMoO_6$, CrAs, As(Ga, Mn, Cr), $CrO_2$, $Fe_3O_4$, $(Fe, Co)_3O_4$, NiMnSb, CoMnGe, CoMnAl and CoMnSi.

4. A magnetoresistive element comprising:
a first ferromagnetic layer whose magnetization is fixed in a direction;
a second ferromagnetic layer whose magnetization is variable in response to an external magnetic field;
a nonmagnetic layer to be provided between the first ferromagnetic layer and the second ferromagnetic layer;
an antiferromagnetic layer to be provided so that the first ferromagnetic layer is sandwiched between the nonmagnetic layer and the antiferromagnetic layer;
a first metal layer which includes Au and is provided so that the antiferromagnetic layer is sandwiched between the first ferromagnetic layer and the first metal layer;

a second metal layer which includes a CuNi alloy and is provided so that the first metal layer is sandwiched between the antiferromagnetic layer and the second metal layer;
a first electrode to be provided so that the second metal layer is sandwiched between the first metal layer and the first electrode; and
a second electrode to be provided so that the second ferromagnetic layer is sandwiched between the nonmagnetic layer and the second electrode,
wherein
at least one of the first ferromagnetic layer and second ferromagnetic layer includes a half metal, and an electric current is passed from the first electrode to the second electrode.

5. The element according to claim 4, further comprising:
a third metal layer including a CuNi alloy, and being provided between the second electrode and the second ferromagnetic layer; and
a fourth metal layer including Au, and being provided between the second electrode and the third metal layer.

6. The element according to claim 4, wherein the half metal is selected from the group consisting of $La_{1-x}Sr_xMnO3$ (0<x<1), $Sr_2FeMoO_6$, CrAs, As(Ga, Mn, Cr), $CrO_2$, $Fe_3O_4$, $(Fe, Co)_3O_4$, NiMnSb, CoMnGe, CoMnAl and CoMnSi.

7. The element according to claim 4, wherein the antiferromagnetic layer includes IrMn.

8. A magnetic head assembly comprising a suspension and an actuator arm, the suspension carrying a magnetoresistive element at one end of the suspension, the actuator arm being mounted onto the other end of the suspension,
wherein
the magnetoresistive element includes:
a first ferromagnetic layer;
a second ferromagnetic layer,
a nonmagnetic layer to be provided between the first ferromagnetic layer and the second ferromagnetic layer;
a first metal layer which includes Au and is provided so that the first ferromagnetic layer is sandwiched between the nonmagnetic layer and the first metal layer;
a second metal layer which includes a CuNi alloy and is provided so that the first metal layer is sandwiched between the first ferromagnetic layer and the second metal layer;
a first electrode to be provided so that the second metal layer is sandwiched between the first metal layer and the first electrode; and
a second electrode to be provided so that the second ferromagnetic layer is sandwiched between the nonmagnetic layer and the second electrode,
wherein
magnetization of either one of the first ferromagnetic layer and the second ferromagnetic layer is fixed in a direction;
magnetization of the other is variable in response to an external field;
at least one of the first ferromagnetic layer and the second ferromagnetic layer includes a half metal; and
an electric current is passed from the first electrode to the second electrode.

9. A magnetic recording/reproducing apparatus comprising the magnetic head assembly according to claim 8 and a magnetic recording medium from which information is reproduced by the use of the magnetoresistive element.

* * * * *